United States Patent [19]

Ferraro

[11] 4,438,486
[45] Mar. 20, 1984

[54] LOW LOSS SNUBBER FOR POWER CONVERTERS

[75] Inventor: Angelo Ferraro, Stillwater, N.Y.

[73] Assignee: General Electric Company, Schenectady, N.Y.

[21] Appl. No.: 351,372

[22] Filed: Feb. 22, 1982

[51] Int. Cl.[3] ...................... H02H 7/12; H02M 7/537
[52] U.S. Cl. ...................................... 363/56; 363/21; 363/134
[58] Field of Search ............................ 363/16, 20–21, 363/55–58, 131–134, 97, 22–26

[56] References Cited

U.S. PATENT DOCUMENTS

| | | | |
|---|---|---|---|
| 4,276,588 | 6/1981 | McLyman et al. | 363/56 |
| 4,286,314 | 8/1981 | Molyneaux-Berry | 363/55 |
| 4,336,587 | 6/1982 | Boettcher, Jr. et al. | 363/56 X |
| 4,355,353 | 10/1982 | Farrer | 363/56 X |

OTHER PUBLICATIONS

E. T. Calkin and B. H. Hamilton, "Circuit Techniques for Improving the Switching Loci of Transistor Switches in Switching Regulators," IEEE Transactions on Industry Applications, vol. 1A–12, No. 4, Jul./Aug. 1976.
R. Wurslin, "Transistor Converter Operating on 380V Three—Phase Mains", 2nd Annual European Power Conversion Conf., Sep. 3–5, 1980, Munich pp. 2.4—1 to 2.4—14.
R. Goldfarb, "A New Non—Dissipative Load—Line Shaping Technique Eliminates Switching Stress in Bridge Converters", Proceedings of Powercon 8, 1981, pp. 1–6.
"Analysis and Design of a Highly Efficient Power Stage for an 18 KHZ, 2.5KW DC—to—DC Converter", R. E. Schroeder, IEEE, 7-81, CH1652—7/18/0000/0273.

Primary Examiner—Peter S. Wong
Attorney, Agent, or Firm—William H. Steinberg; James C. Davis, Jr.; Marvin Snyder

[57] ABSTRACT

A low loss snubber provides stress relief for a first controllable semiconductor switch. The low loss snubber comprises a capacitor in series with a diode. This series combination is connected across the first switch, with the diode poled to conduct current to charge the capacitor when the first switch turns off. The low loss snubber further comprises an energy retrieval converter for removing energy from the capacitor when the first switch turns on. The energy retrieval converter has a second controllable semiconductor switch which is repeatedly turned on and off responsive to the first switch remaining in the closed position. An inductor means is in series with the second switch and the capacitor is provided for transferring the energy stored in the inductor means to an external load when the second switch is open.

11 Claims, 17 Drawing Figures

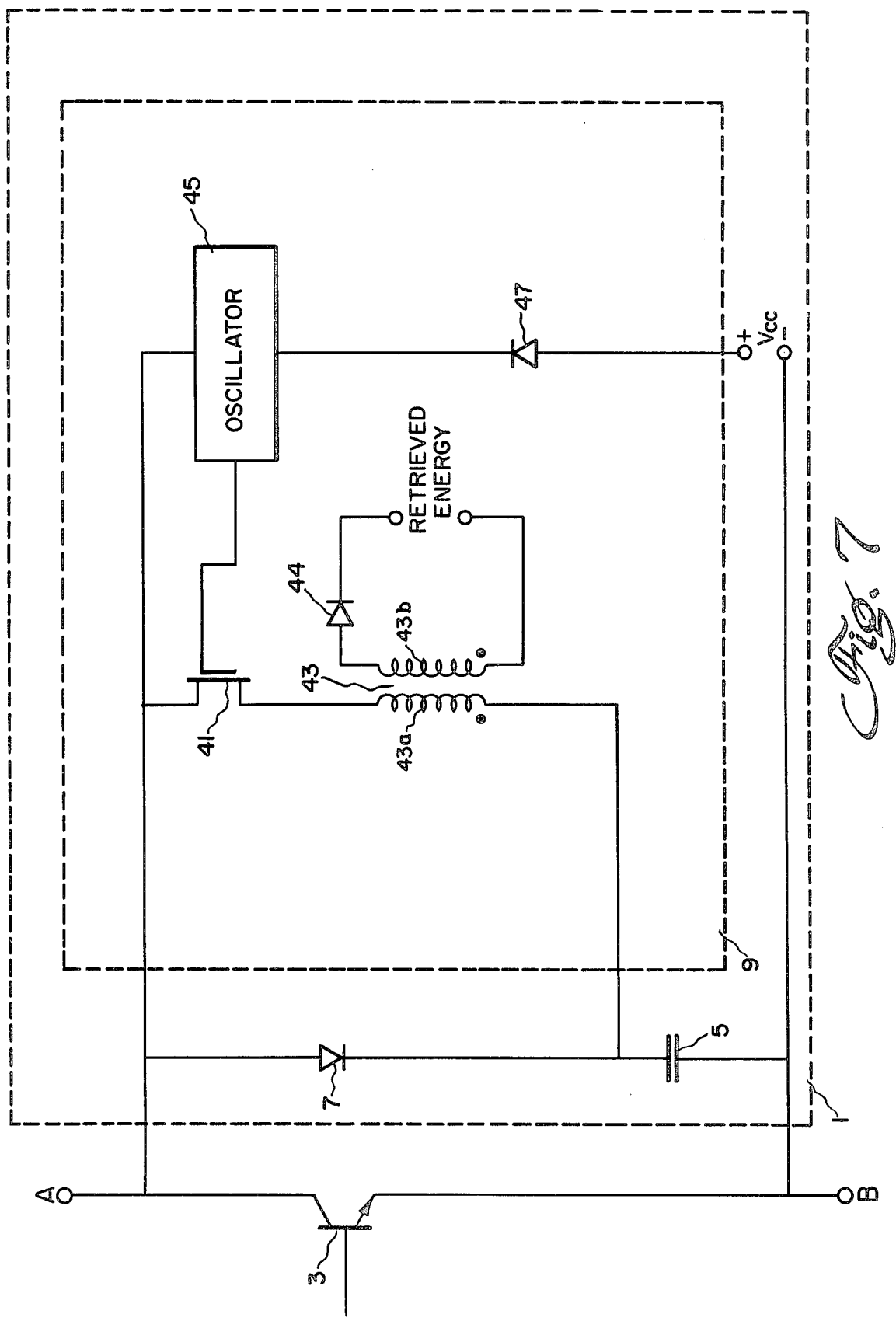

LOW LOSS SNUBBER FOR POWER CONVERTERS

This invention relates to snubbers used to relieve switching stresses in controlled semiconductor switches and more particularly to low loss snubbers.

BACKGROUND OF THE INVENTION

Snubbers are used to reduce turn-off stresses of controlled semiconductor switches. A capacitor in parallel with the switch to be protected reduces the rate of rise of voltage across the switch when the switch is turned off, absorbing energy that would have had to be dissipated by the switch. Conventional snubber circuitry introduces losses since the charge on the capacitor is dissipated through a resistor to prepare for the next switch turn-off. The controlled semiconductor switch carries the discharge current of the capacitor when the switch is on. If the switch to be protected is part of a power converter (a dc-dc or a dc-ac type, for example) and the converter operates at or slightly above the power utility frequencies, snubber losses can be maintained at acceptable levels using standard techniques. However, as the power levels and internal switching frequency of the power converter continues to increase, the resultant losses from conventional snubber circuitry proportionally increase. This is demonstrated by $P=(1/2T)(\Delta CV^2/\Delta t)$ for a capacitive shunt snubber, where P is the snubber circuitry power dissipation, T is the switching period of the switch protected by the snubber, C is the value of the capacitor used in the snubber and V is the voltage across the capacitor in time $\Delta t$. The power dissipated is proportional to the frequency of operation. It can clearly be seen that as switching frequencies rise from 60 to 400 Hertz to 10 or 20 kHz, this loss cannot be justified. This is also especially true when the converter must operate and maintain good efficiencies at light loads. Furthermore, in addition to the loss in efficiency, there is a substantial increase in the cost of the dissipative components handling the increased energy waste.

An object of the present invention is to provide a low loss number, in which the snubber components are chosen for optimum stress relief.

A further object of the present invention is to provide a low loss snubber which occupies less volume than conventional snubbers.

SUMMARY OF THE INVENTION

In one aspect of the present invention, a low loss snubber is set forth which provides stress relief for a first controllable semiconductor switch. The low loss snubber comprises a capacitor in series with a diode. This series combination is connected across the first switch, with the diode poled to conduct current to charge the capacitor when the first switch turns off. The low loss snubber further comprises an energy retrieval converter for removing energy from the capacitor when the first switch turns on. The energy retrieval converter has a second controllable semiconductor switch which is repeatedly turned on and off responsive to the first switch remaining in the closed position. An inductor means is in series with the second switch, and the capacitor transfers the energy stored in the inductor means to an external load when the second switch is open.

BRIEF DESCRIPTION OF THE DRAWING

The features of the invention believed to be novel, are set forth with particularity in the appended claims. The invention itself, however, both as to organization and method of operation, together with further objects and advantages thereof, may best be understood by reference to the following description taken in conjunction with the accompanying drawing in which:

FIG. 7 is still another embodiment, part schematic, part block diagram of the present invention.

DETAILED DESCRIPTION OF THE INVENTION

Figure 1:
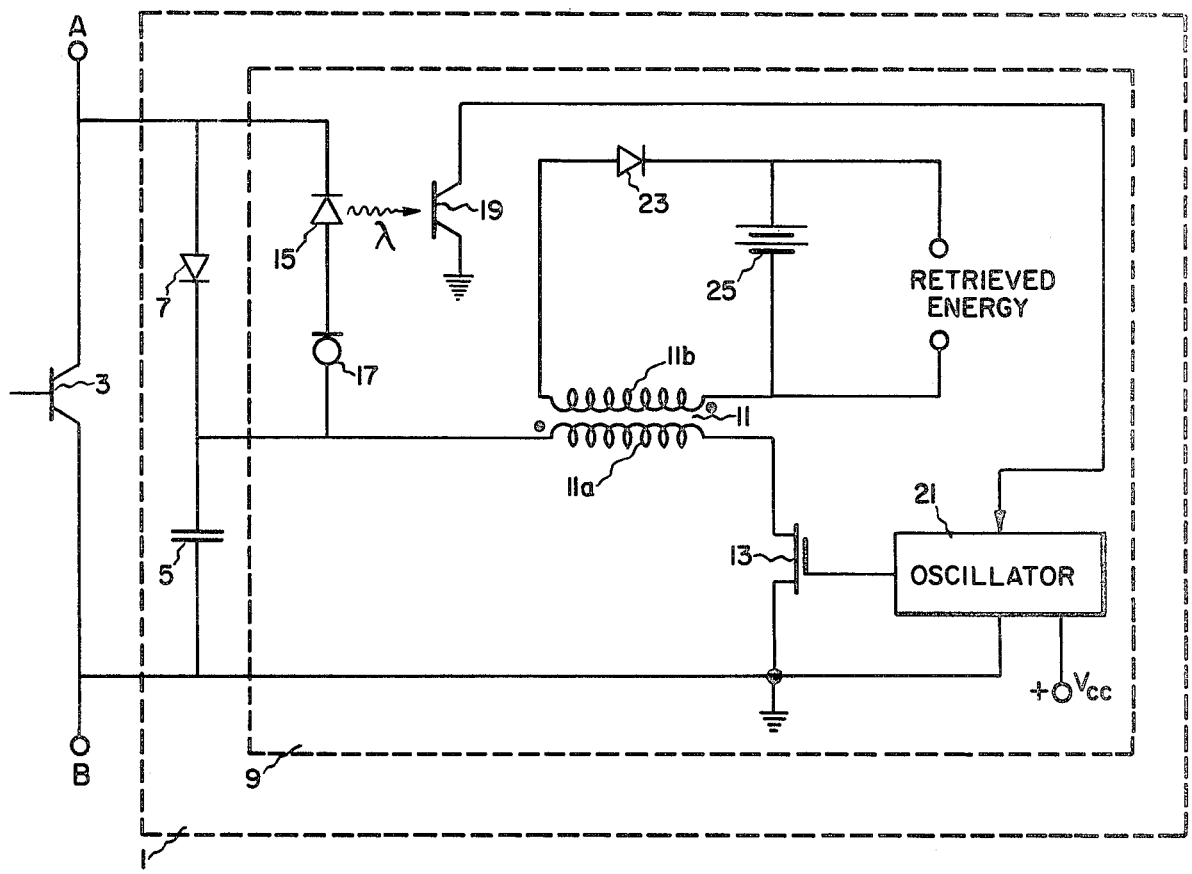
FIG. 1 is a part schematic, part block diagram representation of one embodiment of the present invention using a fly-back converter.

Referring now to the drawing wherein like numerals indicate like elements there is shown in FIG. 1 a low loss snubber 1 for providing stress relief for a controllable semiconductor switch 3, which can be any of the switches in a power converter such as a dc-to-dc switching converter or a dc-ac inverter or any other apparatus in which power is being controlled by repetitive switching. The controllable switch shown in FIG. 1 is a bipolar transistor but silicon controlled rectifiers, gate turn-off thyristors, field control thyristors and other similar semiconductor devices can also be protected by the invention. The low loss snubber has a capacitor 5 connected in series with a diode 7. The series combination of the diode 7 and capacitor 5 is connected across the switch 3. The diode is poled to conduct current to charge capacitor 5 when the switch 3 turns off. Since transistor 3 is shown as an NPN transistor, the anode of diode 7 is connected to the collector of transistor 3.

The primary winding 11a of transformer 11 employed in an energy retrieval converter 9, which is part of the low loss snubber, is connected in series with a controllable semiconductor switch shown in the present embodiment as a power MOSFET 13. The series combination of the primary winding of transformer 11 and the FET 13 is connected across capacitor 5. Connected across diode 7 is a voltage sensor which in the present embodiment comprises light emitting diode (LED) 15 and a current source 17. A biasing resistor could be used in place of the current source 17, with an attendant sacrifice in dynamic response. The current source 17 could be of a discrete transistor design of a field effect regulator diode such as industry standard 1N5299. The cathode of diode 15 is connected to the anode of diode 7. The LED 15 is optically coupled to a phototransistor 19. The output of the transistor 19 is connected to a retriggerable oscillator 21 which in the present embodiment generates rectangular pulses at a 200 kilohertz frequency. The output of the oscillator is connected to the gate of FET 13. The secondary winding of transformer 11 is connected across the series combination of a diode 23 and a load shown as a battery 25. The dotted end of the primary winding 11b of transformer 11 is connected to capacitor 5 while the dotted end of the secondary winding of transformer 11 is connected to the negative side of the battery. The dots on the transformer winding adhere to the convention that the dotted ends of the transformer will have the same relative polarity of voltage at the same time.

Figure 1A:
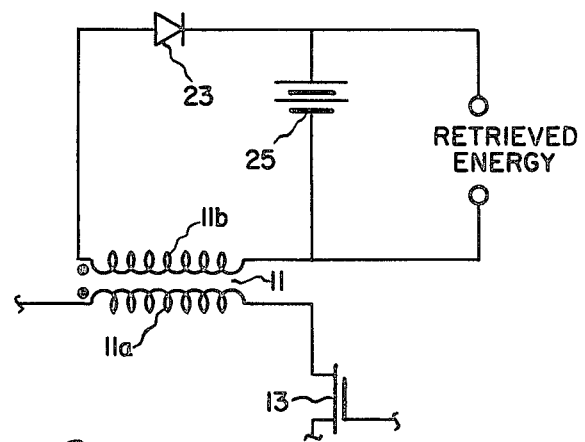
FIG. 1A shows an alternate configuration of the transformer in FIG. 1.
Figure 2:
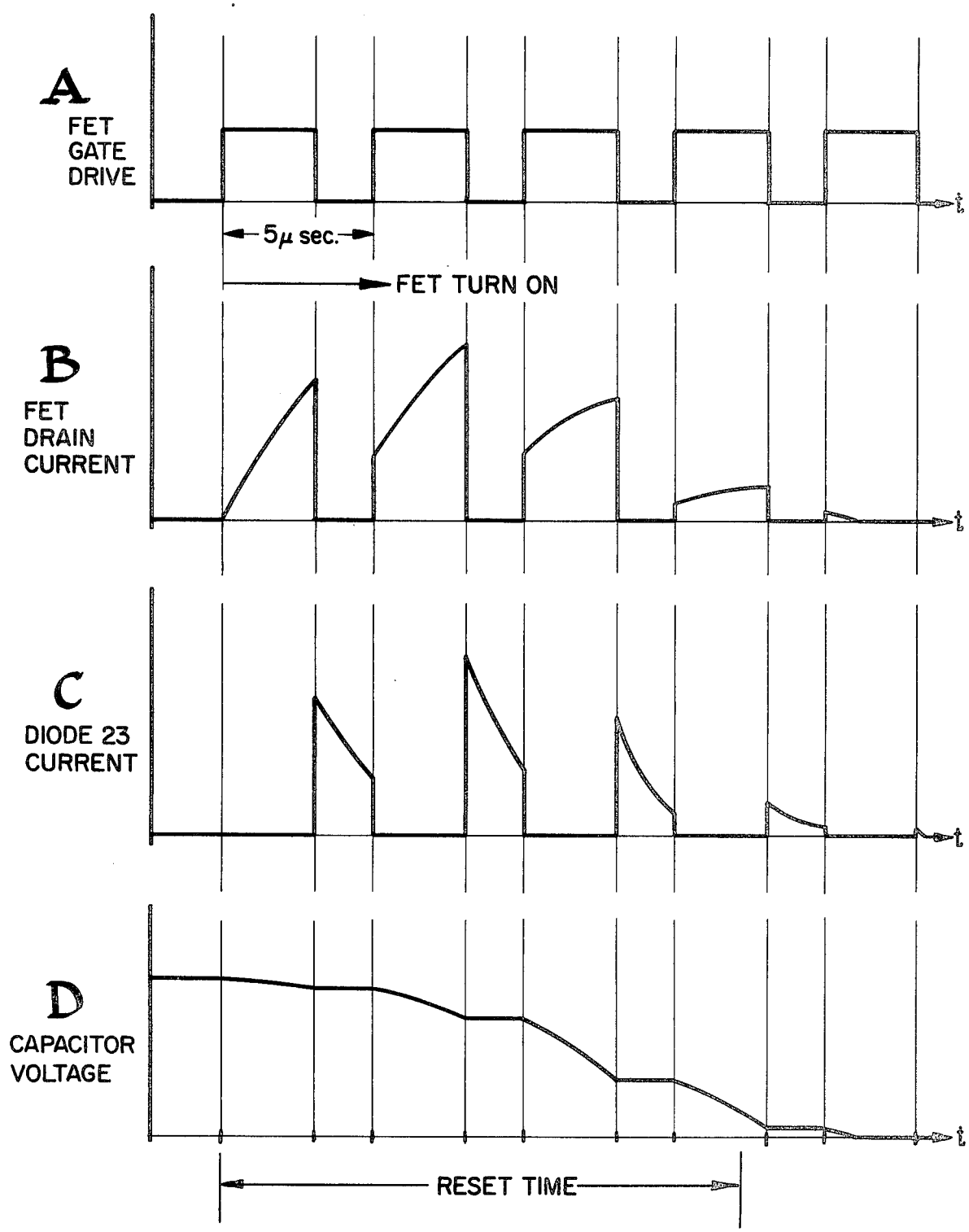
FIGS. 2A, B, C and D are waveform diagrams helpful in explaining the operation of FIG. 1.

The operation of the circuit of FIG. 1 will now be explained with reference to the waveforms in FIGS. 2A, B, C and D. When transistor 3, which is part of a larger circuit (not shown) such as a power converter, is biased out of conduction to stop power flow between terminals A and B, snubber 1 controls the rate of rise of voltage across transistor 3 by charging capacitor 5 through diode 7. This stress relieving operation is performed only by these two components and can easily be optimized to the dynamics of transistor 3. When transistor 3 turns on (with the subsequent cycle of the circuit not shown), the voltage sensed across diode 7 turns on oscillator 21. This is accomplished by the voltage from capacitor 5 reverse biasing diode 7 and causing the current source to provide a constant current to LED 15. LED 15 is optically coupled to phototransistor 19 which thereupon turns on oscillator 21. Oscillator 21 provides a rectangular pulse shown in FIG. 2A, to FET 13, turning the FET on and causing current to flow from capacitor 5 through the primary winding of transformer 11 and FET 13. FIG. 2B shows the FET 13 drain current resulting from rectangular pulses of FIG. 2A. At the end of the rectangular pulse from oscillator 21, FET 13 turns off and the energy in the magnetic field of the transformer generates a current through diode 23 to the battery. The current in diode 23 is shown in FIG. 2C. Succeeding pulses from the oscillator cause the charge on the capacitor to continue to decrease so that the capacitor will be ready again when transistor 3 turns off. The reset time for capacitor 5 shown in FIG. 2D, is defined as the time converter 9 requires to discharge capacitor 5 to a value which assures reliable switching of transistor 3. The relative polarities indicated by the dots or transformer 11 cause the configuration shown in FIG. 1 to act as a flyback converter. If the polarity dot of the secondary winding were moved to the opposite end of the winding as shown in FIG. 1A, the circuit would operate as a forward converter, with power transferred to the battery by transformer action when the FET is biased on. The flyback configuration can provide stepup action with a 1 to 1 transformer turns ratio. Stepup action can be obtained from the forward converter by adjusting the turns ratio. The external load need not be a battery, but could instead be the external ac or dc, power supply (not shown), of which the switch is a part, or a biasing circuit for transistor switch 3.

Figure 3:
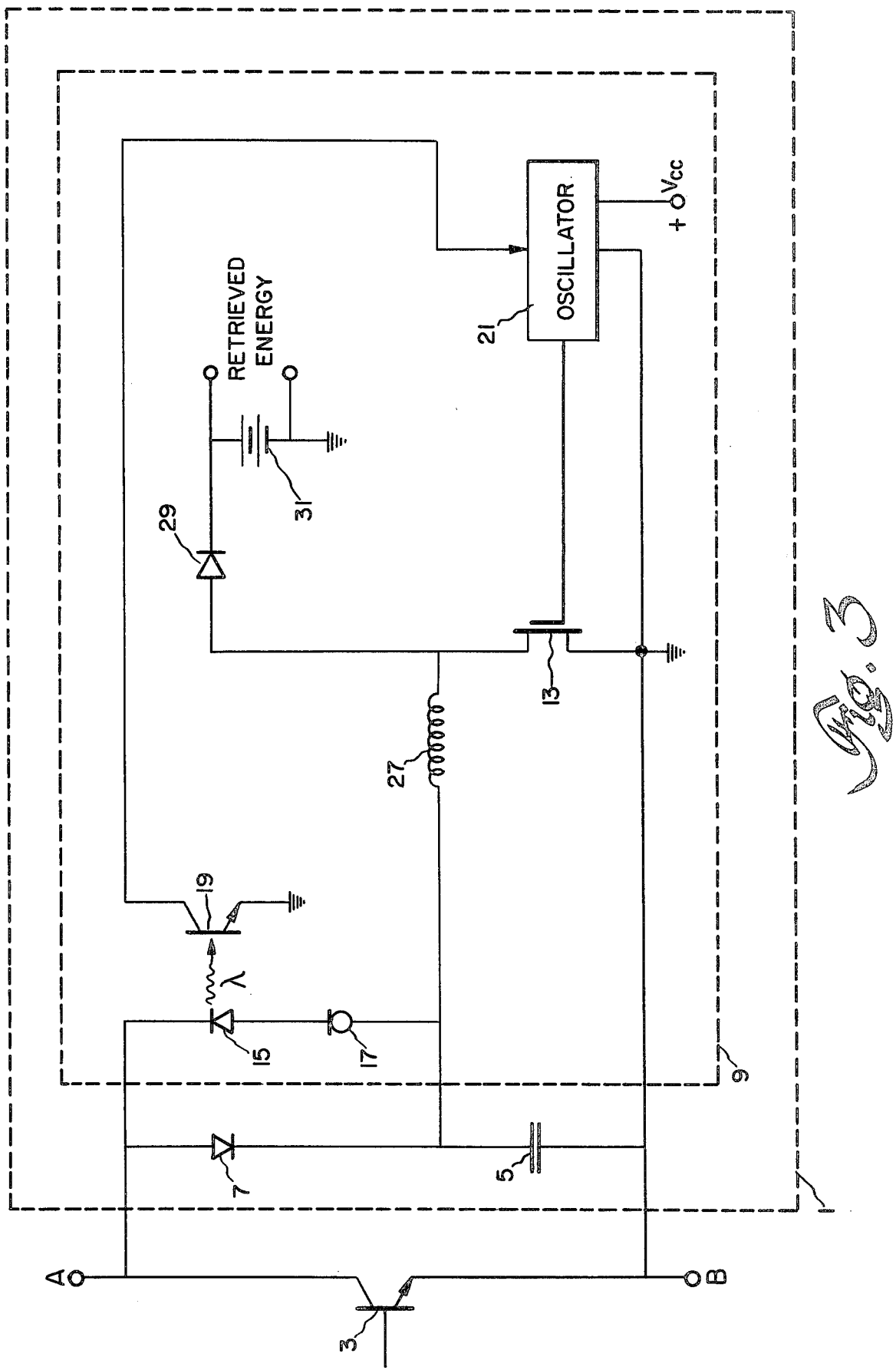
FIG. 3 is a part schematic, part block diagram representation of another embodiment of the present invention having a constant duty cycle control and no transformer isolation.

Referring now to FIG. 3, a low loss snubber 1 is shown having an energy retrieval converter 9 that is not transformer isolated from its load. Elements 3, 5, 7, 13, 15, 17, 19 and 21 are connected as described in FIG. 1. In place of the primary winding of transformer 11 an inductor 27 is used. The anode of a diode 29 is connected between the inductor 27 and FET 13, and connected between the cathode of the diode 29 and terminal B is a load shown as a battery 31.

Figure 4:
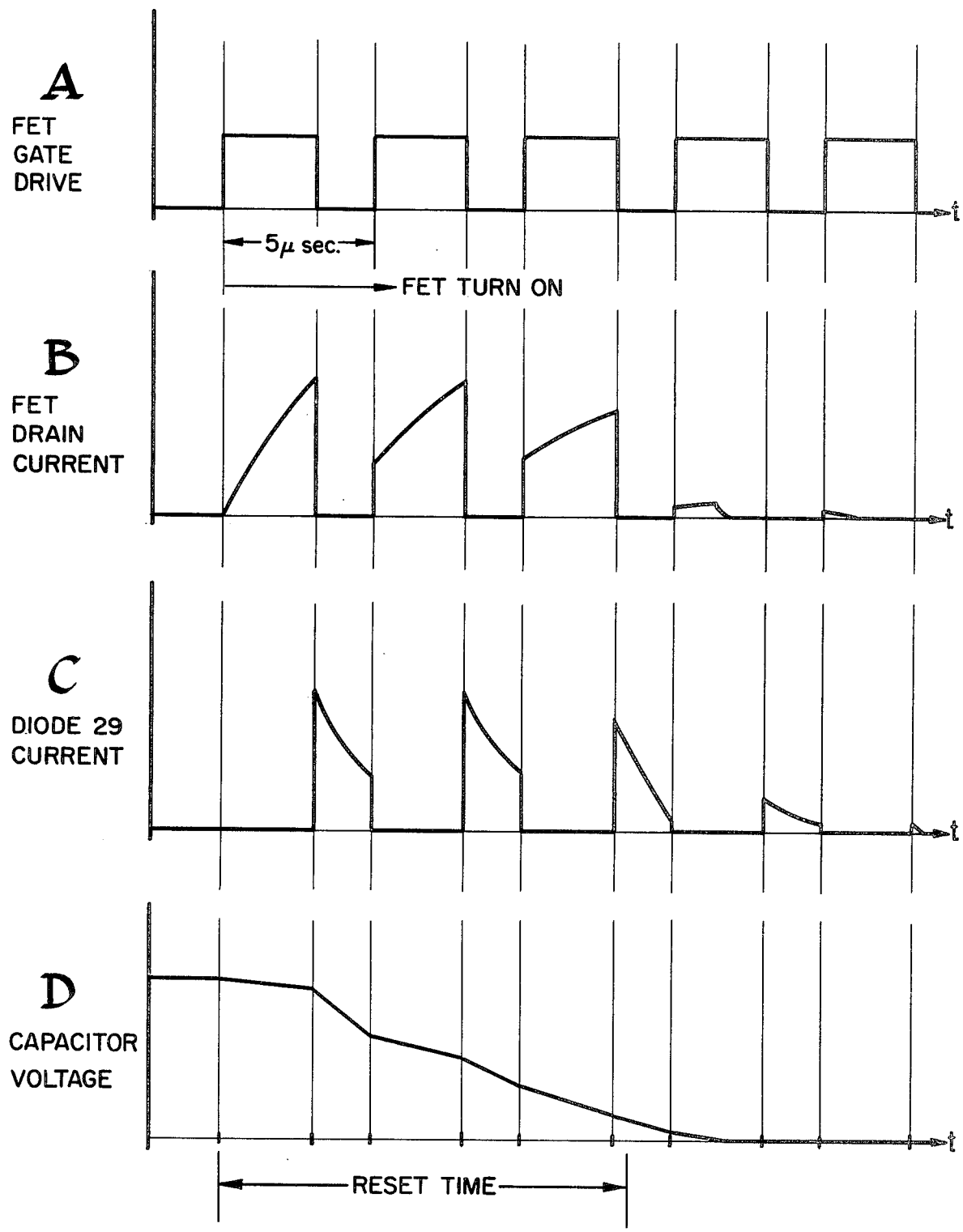
FIGS. 4A, B, C and D are waveform diagrams helpful in explaining the operation of FIG. 3.

The operation of the circuit in FIG. 3 will now be explained with reference to FIGS. 4A, B, C and D. When transistor 3 turns off, capacitor 5 charges as previously described. When transistor 3 turns on again, the voltage sensor turns on oscillator 21 which provides pulses that gate FET 13 into conduction. The oscillator pulses are shown in FIG. 4A. When FET 13 is gated on, current flows from capacitor 5 through inductor 27, through the FET and back to the capacitor. The FET drain current is shown in FIG. 4B. When the pulse from oscillator 21 ends, the FET turns off and the voltage across the inductor reverses, forward biasing diode 29. The capacitor 5 and the inductor 27 provide current to the battery 31 through diode 24 further discharging the capacitor. The diode current waveform is shown in FIG. 4C and the capacitor voltage is shown in FIG. 4D. The leading edge of the rectangular pulse from oscillator 21 again turns on FET 13 and energy again is stored in the inductor to be later transferred to the load when the FET turns off. After several such cycles the capacitor should be substantially discharged, ready for transistor 3 to turn off again.

Figure 5:
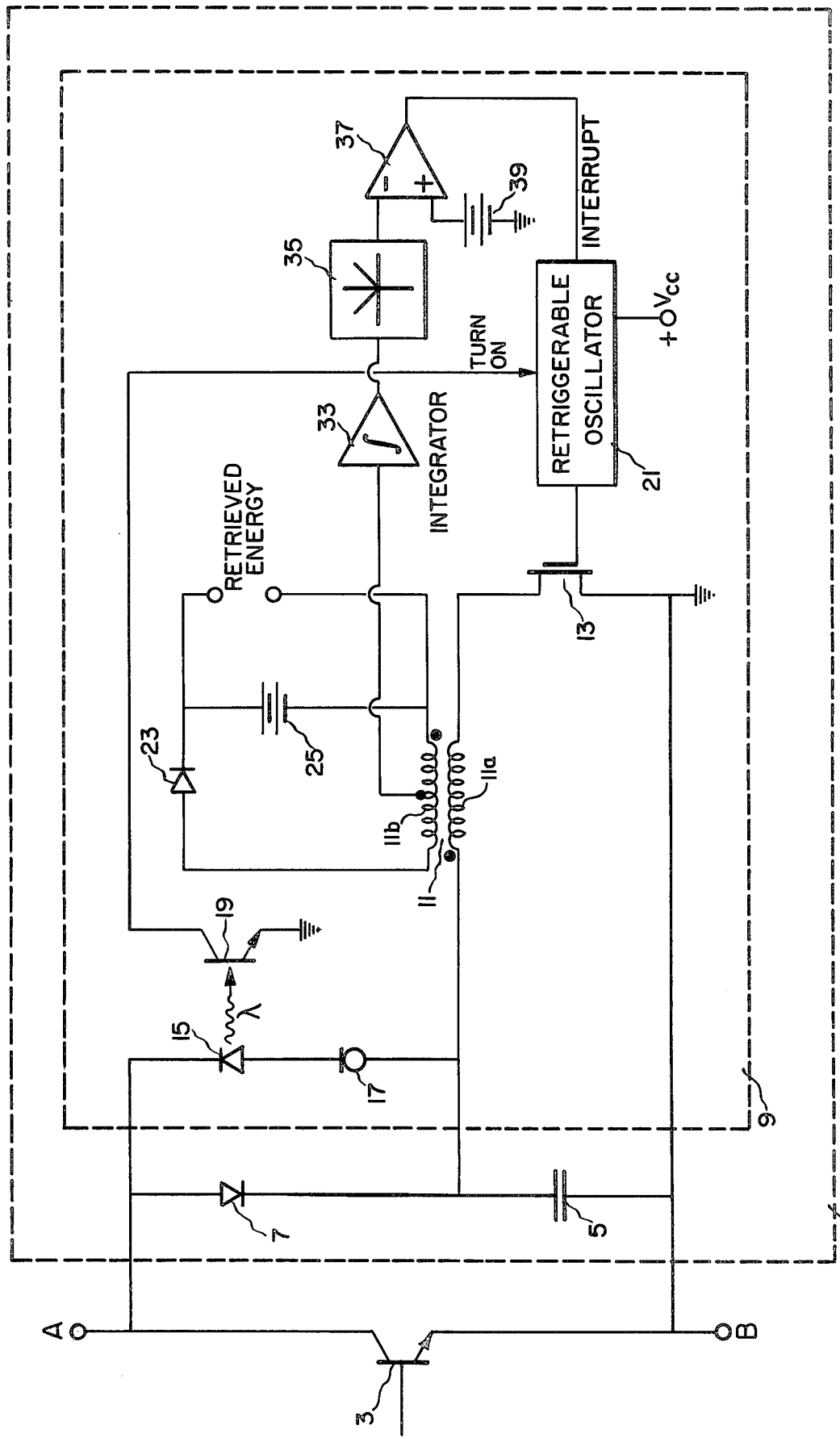
FIG. 5 is another embodiment, part schematic, part block diagram of the present invention using a constant flux control.

Referring now to FIG. 5 a low loss snubber 1 is shown connected across a transistor 3. Elements 5, 7, 11, 13, 15, 17, 19, 21, 23 and 25 are configured as described in connection with FIG. 1. In addition, the secondary 11b of transformer 11 is center tapped and provides a signal to an integrator 33, the output of which is connected to an absolute value circuit 35. A comparator 37 has at its noninverting input a flux reference voltage 39 and at its inverting input the output of absolute value circuit 35. The output of the comparator provides an interrupt signal to oscillator 21.

Figure 6:
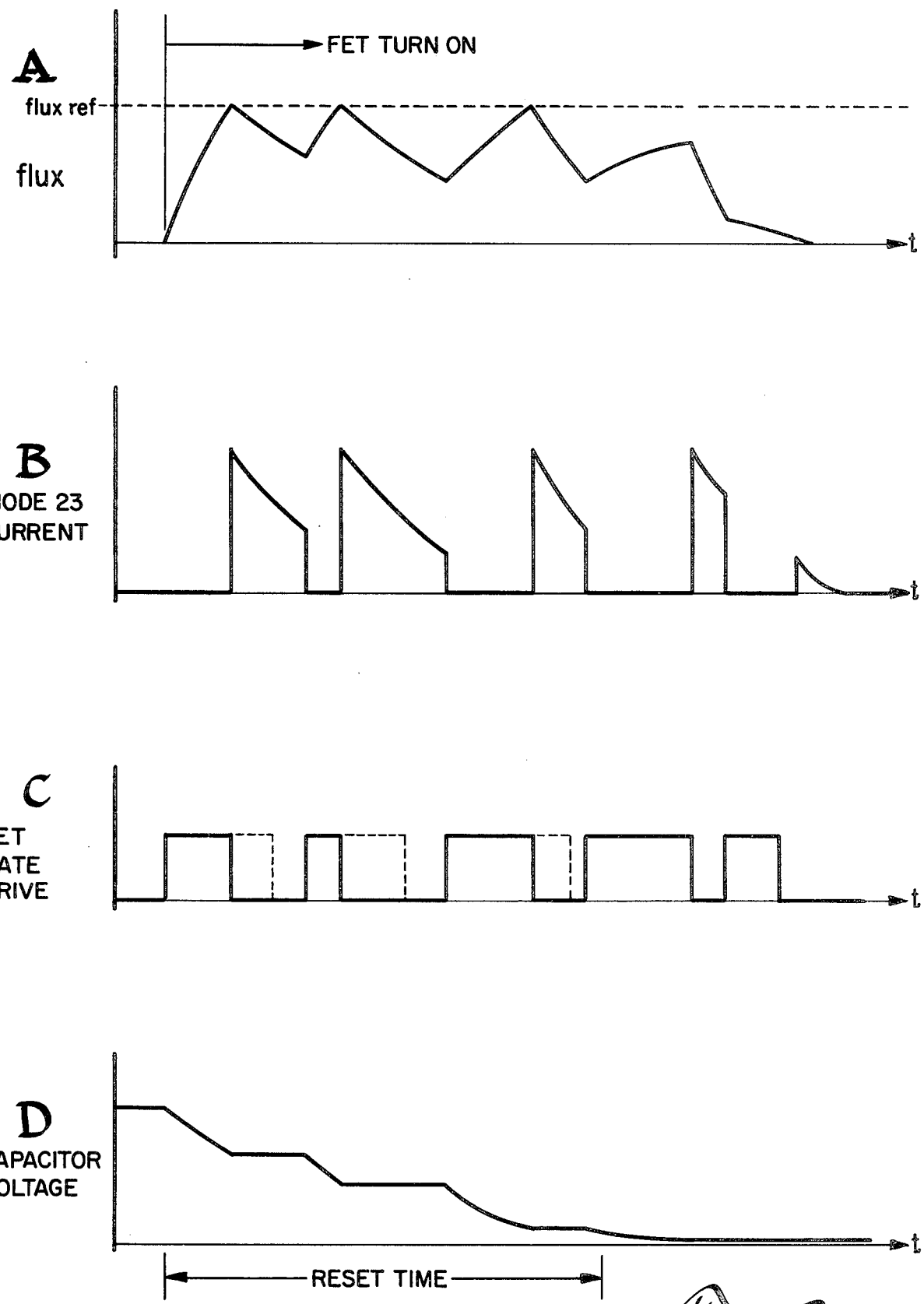
FIGS. 6A, B, C and D are waveform diagrams helpful in explaining the operation of FIG. 5.

The operation of FIG. 5 will now be explained with reference to FIGS. 6A, B, C and D. When transistor 3 turns off, capacitor 5 charges as previously described. When transistor 3 turns on again, the photodiode turns on oscillator 21 which provides a pulse to turn on FET 13. With the FET 13 turned on, the capacitor discharges through the primary winding 11a of transformer 11, causing an increase in flux in the transformer. The flux in the transformer is measured by integrating the transformer voltage in integrator 33. For this purpose the transformer voltage can be obtained from an additional winding (not shown) or from the primary or secondary winding. In the present embodiment, the center tap on the transformer secondary is used. The absolute value of the flux, corresponding to the absolute value of the integrated secondary 11b voltage is produced by circuit 35 and compared with a predetermined level of flux in comparator 37. When the flux in the transformer reaches a predetermined level, as shown in FIG. 6A, the rectangular pulse being provided by oscillator 21 is terminated by a signal provided by comparator 37 to the oscillator. The dashed lines in FIG. 6C show the shapes of the rectangular pulses would be if they were not interrupted by the flux control upon reaching a predetermined flux level in the transformer. FET 13 is turned off each time the oscillator pulse terminates preventing further flux buildup. With FET 13 turned off, the magnetic field in the transformer 11 decreases, providing a current through diode 23 to the battery 25 and discontinuing the interrupt signal provided by comparator 37. When the next leading edge of a rectangular pulse provided by oscillator 21 begins, FET 13 is again turned on and flux again begins to build up in transformer 11 until the predetermined value is reached at which time the pulse is terminated and the flux level in the transformer again falls. After several pulses, the charge on the capacitor 5 will have dropped sufficiently that the predetermined flux level will not be reached prior to the end of each uninterrupted rectangular pulse, at which time the remaining charge on the capacitor will be further discharged as in the constant duty cycle embodiment of FIG. 1. The voltage across the capacitor as it is being discharged is shown in FIG. 6D. The last pulse shown in FIG. 6C is terminated when capacitor 5 is sufficiently discharged that current source 17 is turned off which, in turn, turns off oscillator 21. The flux control thus provides overcurrent protection for FET 13 and transformer 11 with little increase in circuit complexity. Optimal use of transformer 11 is thereby achieved.

Another embodiment of the present invention is shown in FIG. 7. A low loss number 1 is provided connected across a transistor 3. Diode 7 and capacitor 5 are connected as previously described. The energy retrieval converter 9 is connected across diode 7. The energy retrieval converter includes an FET 41 in series with the primary winding 43a of transformer 43. This series combination is connected across diode 7. The secondary winding 43b of transformer 43 is connected through a diode 44 to a load not shown. An oscillator 45 receives power through a diode 47 and provides a ground connection through the collector of transistor 3.

The operation of FIG. 7 will now be explained. When transistor 3 turns off, capacitor 5 charges, as described in conjunction with FIGS. 1 and 3 and 5. When transistor 3 turns on, the oscillator 45 is connected across its power supply through transistor 13 and provides pulses to the gate of FET 41. When FET 41 turns on, current is supplied from capacitor 5 through the primary winding of transformer 43, through FET 41 and transistor 3, back to the capacitor. When the rectangular pulse ends, transistor 41 turns off and the magnetic energy stored in the transformer winding is provided to the load. In the embodiments shown in FIGS. 1, 3 and 5, transistor 3 does not carry the discharge current of capacitor 5 as in the circuit of FIG. 7. In configurations where the discharge currents of the capacitor is not a significant burden, the simplified circuit of FIG. 7 will be useful.

While a flux control and a constant duty cycle control have been shown, pulse width modulation control of the oscillator, dependent on capacitor voltage or FET drain current, could alternatively be used in the circuits of the invention.

The circuits set forth in FIGS. 1, 3, 5 and 7 can be fabricated using circuit integration techniques. Using a power MOSFET as the converter switching element will keep switching losses quite low. High switching frequencies (200 kHz) reduce the size and cost of the inductive elements to the extent that the circuits can be made smaller than the dissipative resistor they replace.

The foregoing describes a low loss snubber in which snubber components can be chosen for optimum stress relief and in which the low loss snubber can occupy a smaller volume than a conventional snubber.

While the invention has been particularly shown and described with reference to several preferred embodiments thereof, it will be understood by those skilled in the art that various changes in form and detail may be made therein without departing from the spirit and scope of the invention.

What is claimed is:

1. A low loss snubber for providing stress relief to a first controllable semiconductor switch comprising:
   a series combination of a diode and a capacitor connected across said first switch, said diode poled to conduct current to charge said capacitor when said first switch opens; and
   an energy retrieval converter for removing energy from said capacitor when said first switch is closed including
   a second controllable semiconductor switch;
   means responsive to the conductive state of said first switch and coupled to said second switch for repeatedly opening and closing said second switch when said first switch is in the closed position;
   inductor means coupled in series with said second switch and said capacitor, said inductor means receiving energy from said capacitor at a rate dependent upon the repeated opening and closing of said second switch; and
   means coupled to said inductor means for receiving energy from said inductor means and transferring said energy to an external load.

2. A low loss snubber for providing stress relief to a first controllable semiconductor switch comprising:
   a series combination of a diode and a capacitor connected across said first switch, said diode poled to conduct current to charge said capacitor when said first switch opens; and
   an energy retrieval converter for removing energy from said capacitor when said first switch is closed including
   a second controllable semiconductor switch;
   means responsive to the conductive state of said first switch and coupled to said second switch for repeatedly opening and closing said second switch to control energy removal from said capacitor when said first switch is in the closed position;
   inductor means coupled in series with said second switch and said capacitor for storing energy transferred from said capacitor when said second switch is closed; and
   means coupled to said inductor means for receiving energy from said inductor means when said second switch is open and transferring said energy to an external load.

3. The snubber of claim 2 wherein said means for repeatedly opening and closing said second switch comprises oscillator means for generating rectangular pulse switching signals.

4. The snubber of claim 3 wherein said inductor means comprises a transformer having a primary winding and a secondary winding, said primary winding coupled in series with said second switch and said capacitor, and said means for receiving energy from said inductor means being coupled to said secondary winding.

5. The snubber of claim 4 wherein said means for repeatedly opening and closing said second switch further comprises means coupled to said transformer for generating a signal proportional to transformer flux, means for comparing the flux signal to a predetermined flux level and providing a signal when said predetermined flux level is exceeded said comparison means being coupled to said oscillator;
   means for interrupting said rectangular pulse when said predetermined flux level is exceeded.

6. An energy retrieval converter for removing charge from a capacitor connected in series with a diode, the series combination thereof being connected across a first controllable semiconductor switch so as to allow said capacitor to build up charge when said first switch opens, said energy retrieval converter comprising:

a second controllable semiconductor switch;

means responsive to the conductive state of said first switch and coupled to said second switch for repeatedly opening and closing said second switch when said first switch is in the closed position;

inductor means coupled in series with said second switch and said capacitor, said inductor means receiving energy from said capacitor at a rate dependent upon the repeated opening and closing of said second switch; and means coupled to said inductor means for receiving energy from said inductor means.

7. An energy retrieval converter for removing charge from a capacitor connected in series with a diode, the series combination thereof being connected across a first controllable semiconductor switch, said charge on said capacitor built up when said first switch closes, said energy retrieval converter comprising:

a second controllable semiconductor switch;

means for repeatedly opening and closing said second switch when said first switch is in the closed position;

inductor means in series with said second switch and said capacitor for storing energy transferred from said capacitor when said second switch is closed, said inductor means receiving energy from said capacitor at a rate dependent upon the repeated opening and closing of said second switch; and means connected to said inductor means for receiving energy from said inductor means when said second switch is open and transferring said energy into an external load.

8. The energy retrieval converter of claim 7 wherein said means for repeatedly opening and closing said second switch comprises oscillator means for generating rectangular pulse switching signals.

9. The energy retrieval converter of claim 8 wherein said inductor means comprises a transformer having a primary winding and a secondary winding, said primary winding coupled in series with said second switch and said capacitor, and said means for receiving energy from said inductor means being coupled to said secondary winding.

10. The energy retrieval converter of claim 9 wherein said means for repeatedly opening and closing said second switch further comprises means coupled to said transformer for generating a signal proportional to transformer flux, means for comparing the flux signal to a predetermined flux level and providing a signal when said predetermined flux level is exceeded said comparison means being coupled to said oscillator;

means for interrupting said rectangular pulse when said predetermined flux is exceeded.

11. A low loss snubber for providing stress relief to a first controllable semiconductor switch comprising:

a series combination of a diode and a capacitor connected across said first switch, said diode poled to conduct current to charge said capacitor when said first switch opens; and an energy retrieval converter for removing energy from said capacitor when said first switch is closed including a second controllable semiconductor switch;

means responsive to the conductive state of said first switch and coupled to said second switch for repeatedly opening and closing said second switch when said first switch is in the closed position;

a transformer having its primary winding coupled in series with said second switch and said capacitor, said primary winding receiving energy from said capacitor at a rate determined by the repeated opening and closing of said second switch; and means coupled to the transformer secondary winding for receiving energy from said capacitor when said second switch is closed and transferring said energy to an external load.

* * * * *